United States Patent [19]

Kobayashi et al.

[11] Patent Number: 4,487,709

[45] Date of Patent: Dec. 11, 1984

[54] PROCESS FOR PRODUCING ELECTRICALLY CONDUCTIVE HIGH POLYMER OF ACETYLENE

[75] Inventors: Yukio Kobayashi; Hideki Shirakawa, both of Yokohama; Sakuji Ikeda, Tokyo, all of Japan

[73] Assignee: Showa Denko K.K., Tokyo, Japan

[21] Appl. No.: 224,518

[22] PCT Filed: Mar. 28, 1980

[86] PCT No.: PCT/JP80/00052

§ 371 Date: Nov. 29, 1980

§ 102(e) Date: Nov. 26, 1980

[87] PCT Pub. No.: WO80/02146

PCT Pub. Date: Oct. 16, 1980

[30] Foreign Application Priority Data

Mar. 29, 1979 [JP] Japan .................................. 54-36284
Mar. 29, 1979 [JP] Japan .................................. 54-36285
Mar. 29, 1979 [JP] Japan .................................. 54-36286
Mar. 29, 1979 [JP] Japan .................................. 54-36287
Apr. 24, 1979 [JP] Japan .................................. 54-49734
Apr. 25, 1979 [JP] Japan .................................. 54-50245

[51] Int. Cl.$^3$ .......................................... H01B 1/00
[52] U.S. Cl. .................................. 252/500; 525/344; 525/377; 528/487; 528/490; 524/419; 524/422; 524/429; 524/165

[58] Field of Search ................ 252/500, 518; 526/185; 525/377, 344; 357/8, 15; 428/901; 524/429, 422, 419, 165, 157; 528/487, 490, 491, 497

[56] References Cited

U.S. PATENT DOCUMENTS

| | | | |
|---|---|---|---|
| 4,222,903 | 9/1980 | Heeger et al. | 252/518 |
| 4,228,060 | 10/1980 | Pey | 252/500 |
| 4,394,304 | 7/1983 | Wnek | 252/500 |
| 4,410,640 | 10/1983 | Kobayashi et al. | 252/500 |

*Primary Examiner*—Josephine L. Barr
*Attorney, Agent, or Firm*—Wenderoth, Lind & Ponack

[57] ABSTRACT

This invention relates to a process for producing an organic semiconductor. More specifically, it relates to a process for producing an electrically conductive acetylene high polymer, which comprises doping an acetylene high polymer having a fibrous microcrystalline (fibril) structure with a specified electron acceptor compound having low toxicity, to obtain an electrically conductive acetylene high polymer having an increased electrical conductivity, and flexibility and heat stability. The electrically conductive acetylene high polymer obtained by the process of this invention is a P-type semiconductor whose electrical conductivity can be freely controlled within the range of $10^{-9}$ to $10^3$ ohm$^{-1}$, cm$^{-1}$, and is useful as a material for photoelectric converter elements such as solar cells and photosensers, and as P-N hetero junction elements.

2 Claims, No Drawings

PROCESS FOR PRODUCING ELECTRICALLY CONDUCTIVE HIGH POLYMER OF ACETYLENE

FIELD OF TECHNOLOGY

This invention relates to an organic semiconductor, and more specifically, to the production of an electrically conductive high polymer of acetylene.

BACKGROUND ART

It has already been known that a powdery high polymer of acetylene obtained by polymerizing acetylene with a Ziegler-Natta catalyst is a semiconductor material useful as electronics and electrical elements. It has also been known that when the powdery acetylene high polymer is treated with an electron acceptor compound, its electrical conductivity increases to 1,000 times at the highest, and when it is treated with an electron donor compound such as ammonia or methylamine, its electrical conductivity decreases to 1/10,000 at most [D. J. Berets et al., Trans. Faraday Soc. 64 823 (1968)]. However, the powdery acetylene high polymer used there is an assembly of non-fibrous microcrystals, and is essentially different in the form of molecular chains from the acetylene high polymer used in this invention which consists of fibrous microcrystals. Hence, it only gives molded articles of low mechanical strength, and the effect of improving its electrical conductivity is not entirely satisfactory.

Some of the inventors of the present invention already discovered and proposed a process for producing a film-like or fibrous acetylene high polymer having a fibrous microcrystalline (fibril) structure (Japanese Patent Publication No. 32581/73). The process for production according to this technique will be described hereinbelow. The film and fibers produced by this process are a crystalline high polymer in which fibrous microcrystals having a diameter of from 200 to 300 Å are randomly oriented. This acetylene high polymer is a linear unsaturated hydrocarbon composed of a chain of cis or trans conjugated double bonds, and is possibly partially crosslinked. The configuration of the double bonds of the acetylene high polymer produced by this process differs depending upon the polymerization temperature. In a high polymer obtained by polymerization at −78° C. or below, 98% of its double bonds are cis bonds. But as the polymerization temperature increases, the proportion of trans bonds increases, and a polymer obtained by polymerization at +150° C. or higher consists almost entirely of trans bonds. When a high polymer containing cis bonds is heat-treated at 200° C. for 30 minutes in vacuum or in an inert gas, it can be isomerized completely to a polymer consisting of trans bonds. By adjusting the treating temperature and time, a high polymer having a desired cis-trans ratio can be produced.

The electrical, mechanical and optical properties of this polymer vary greatly according to the cis-trans ratio. For example, the electrical conductivity at 25° C. of the polymer is $1.7 \times 10^{-9}$ ohm$^{-1}$.cm$^{-1}$ when its cis content is about 95%, and $4.4 \times 10^{-5}$ ohm$^{-1}$.cm$^{-1}$ when its trans content is about 95%. The break strength of the polymer is 3.8 kg/mm$^2$ when its cis content is 98%. It gradually decreases with increasing trans content, and is 2.4 kg/mm$^2$ when its trans content is 96%. The break elongation of the polymer ranges from 140% at which the cis content is 98% to below 5% at which the trans content is 96%. Accordingly, a film-like or fibrous acetylene high polymer having a high cis content can be stretched by a mechanical operation to orient its fibrous microcrystals in the stretching direction, and therefore, a monoaxially oriented film-like or fibrous acetylene high polymer having a high cis content can be produced. When the monoaxially stretched acetylene high polymer is heated under mechanical tension to isomerize the cis bonds to trans bonds, its stretching proceeds further whereby a film-like or fibrous acetylene high polymer having a high trans content and being oriented to a higher degree can be produced.

It has already been reported that when the film-like or fibrous acetylene polymer produced by this process is doped with an electron acceptor compound, for example halogens such as $Cl_2$, $Br_2$, $I_2$, ICl or IBr or arsenic pentafluoride, its electrical conductivity increases, and especially when the electron acceptor compound is arsenic pentafluoride, a highly conductive acetylene high polymer having an electrical conductivity of 560 ohm$^{-1}$.cm$^{-1}$ at the highest can be obtained [J. C. S. Chem. Commun. 578 (1977), Phys. Rev. Lett. 39, 1098 (1977), J. Am. Chem. Soc., 100, 1013 (1978), J. Chem. Phys. 69, 5098 (1978)].

DISCLOSURE OF THE INVENTION

The electrical conductivity of a conductive acetylene high polymer obtained by doping the aforesaid film-like or fibrous acetylene high polymer with conventional electron acceptor compounds is not on an entirely satisfactory high level. Furthermore, as a result of doping, the flexibility of the acetylene high polymer is markedly reduced. Moreover, these electron acceptor compounds have strong toxicity to man, and lend themselves to difficult handling. In addition, the heat stability of an electrically conductive acetylene high polymer obtained by doping the film-like or fibrous acetylene high polymer with such an electron acceptor compound is about 150° C. at the highest. Those skilled in the art, therefore, have desired to develop an electron acceptor compound which gives a higher electrical conductivity, does not impair the flexibility of an acetylene high polymer, is less toxic, and gives an electrically conductive acetylene high polymer having higher heat stability.

In view of this, the present inventors extensively investigated electron acceptor compounds which would remedy at least one of the aforesaid defects. These investigations have led to the present invention.

The present invention thus provides a process for producing an electrically conductive acetylene high polymer, which comprises doping an acetylene high polymer having a fibrous microcrystalline (fibril) structure with at least one electron acceptor compound selected from the group consisting of nitric acid, fuming nitric acid, sulfuric acid, fuming sulfuric acid, sulfur trioxide, superstrong acids, esters of the superstrong acids, aluminum tribromide, boron tribromide, boron trichloride, compounds of the following formulae (1), (2) and (3), and substituted or unsubstituted naphthoquinones.

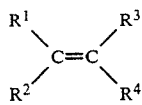

(1)

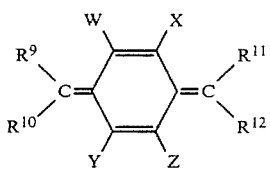

(2)

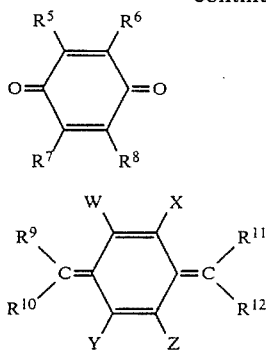

(3)

(wherein $R^1$ to $R^{12}$ represent a hydrogen atom, a halogen atom, a cyano group or a nitro group provided that $R^1$ to $R^4$, and $R^9$ to $R^{12}$, respectively, are not hydrogen atoms at the same time, and W, X, Y and Z are identical or different and each represents a hydrogen atom, a halogen atom, a cyano group or an alkyl or alkoxide group having not more than 5 carbon atoms.

By using nitric acid, fuming nitric acid, sulfuric acid, fuming sulfuric acid, sulfur trioxide, or a superstrong acid or its ester as the electron acceptor compound (also to be referred to as a "dopant" since it acts as a dopant in this invention), an electrically conductive acetylene high polymer having a high electrical conductivity is obtained while retaining the flexibility of the starting polymer. The toxicity of these dopants to man is relatively low, and they are easy to handle. Hence, the use of these dopants is very advantageous industrially.

On the other hand, by using the compounds of general formulae (1), (2) and (3) or naphthoquinones as the dopant, not only can an electrically conductive acetylene high polymer be obtained, while retaining the flexibility of the starting acetylene polymer, but also the heat stability of the resulting electrically conductive acetylene high polymer is 150° C. or more. Furthermore, since these dopants have very low toxicity to man, they lend themselves to easy handling and are very advantageous industrially.

By using aluminum tribromide, boron tribromide or boron trichloride as the dopant, an electrically conductive acetylene high polymer having flexibility can be obtained. Moreover, since these dopants have relatively low toxicity to man, they lend themselves to easy handling and are industrially advantageous.

The electrical conductivity of the acetylene high polymer can be controlled freely over a range of from $10^{-9}$ to $10^{-3}$ ohm$^{-1}$.cm$^{-1}$ by properly varying the type and amount of the dopant used.

BEST MODE FOR PRACTICING THE INVENTION

The acetylene high polymer having a fibrous microcrystalline structure used in this invention can be produced, for example, by the following methods.

(A) A method for producing a film-like or fibrous acetylene high polymer, which comprises introducing acetylene gas into a catalyst solution prepared by dissolving a catalyst system composed of a transition metal compound and an organometallic compound in an aromatic hydrocarbon such as toluene or an aliphatic hydrocarbon such as hexadecane and polymerizing it on the interface between the acetylene gas and the catalyst solution; or coating the catalyst solution on the wall of a glass vessel and polymerizing acetylene on the coated surface of the glass vessel (Japanese Patent Publication No. 32581/73).

(B) A method for producing an acetylene polymer which involves using hexane as a solvent and a special transition metal compound, $\mu\text{-}(\eta^1\text{:}\eta^5\text{-cyclopentadienyl})\text{-}$ tris($\eta$-cyclopentadienyl)dititanium (Ti-Ti) [$(C_5H_4)_5(C_5H_5)_3Ti_2$], [S. L. Hsu et al. J. Chem. Phys., 69(1), 106–111 (1978)].

(C) A process for producing a gel-like acetylene high polymer having a fibril structure which comprises polymerizing acetylene using a transition metal compound and an organometallic compound as a catalyst, the concentration of the transition metal compound being 0.0001 to 0.1 mole per liter of the polymerization solvent.

Methods for producing the acetylene high polymer that can be used in this invention are not limited to the above-exemplified methods, and it can be produced by any method of production which gives an acetylene high polymer having a fibrous microcrystalline (fibril) structure.

Nitric acid used in this invention is a compound represented by the chemical formula $HNO_3$ and its aqueous solution, and fuming nitric acid is concentrated nitric acid containing a large quantity of nitrogen dioxide ($NO_2$).

Doping of the acetylene high polymer having a fibrous microcrystalline structure with nitric acid or fuming nitric acid is carried out, for example, by (1) a method which comprises dipping the acetylene high polymer directly in nitric acid or fuming nitric acid, (2) a method which comprises placing nitric acid or fuming nitric acid in an organic or inorganic solvent not reactive with it, dipping the acetylene polymer in the solvent, and doping the acetylene high polymer with nitric acid or fuming nitric acid which diffuses through the solvent, or (3) a method which comprises placing the acetylene high polymer in vacuum or in an inert gas, and doping the acetylene polymer with a vapor of nitric acid or fuming nitric acid.

When the acetylene polymer is doped with nitric acid or fuming nitric acid, it does not change in appearance but retains its silver metallic luster if the concentration of nitric acid or fuming nitric acid in the polymer is low. But with an increase in its concentration, the polymer gradually assumes a golden color. By adjusting the doping amount of nitric acid or fuming nitric acid, the electrical conductivity of a high acetylene polymer having a high cis content can be adjusted as desired within a range of $10^{-9}$ to $10^3$ ohm$^{-1}$.cm$^{-1}$ and the electrical conductivity of an acetylene high polymer having a high trans content can be adjusted as desired within a range of $10^{-5}$ to $10^3$ ohm$^{-1}$.cm$^{-1}$. The electrical conductivity of a high polymer having an arbitrary cis-trans ratio can be varied freely within a range from the electrical conductivity of undoped polymer to $10^3$ ohm$^{-1}$.cm$^{-1}$.

The mechanical properties of the acetylene high polymer doped with nitric acid or fuming nitric acid are much the same as those of the original high polymer. Accordingly, the flexibility of the high polymer is retained, and in particular, a doped high polymer having a high cis content has good flexibility.

The amount of nitric acid or fuming nitric acid with which the acetylene high polymer is doped is at most 300 parts by weight per 100 parts by weight of the acetylene high polymer.

Sulfuric acid used in this invention is a compound expressed by the chemical formula $H_2SO_4$ and its aqueous solution. Specifically, it includes pure sulfuric acid, concentrated sulfuric acid, sulfuric acid and dilute sulfuric acid.

Doping of the acetylene high polymer having a fibrous microcrystalline structure with sulfuric acid is carried out, for example, by (1) a method which comprises dipping the acetylene high polymer directly in sulfuric acid, (2) a method which comprises placing sulfuric acid in an organic or inorganic solvent not reactive with it, dipping the acetylene high polymer in the solvent, and doping the acetylene high polymer with sulfuric acid which diffuses through the solvent, or (3) a method which comprises placing the acetylene high polymer in vacuum or in an inert gas, and doping the acetylene high polymer with a vapor of sulfuric acid.

When the acetylene high polymer is doped with sulfuric acid, it does not change in appearance but retains a silver metallic luster if the concentration of sulfuric acid in the polymer is low. But with an increase in concentration, the acetylene high polymer gradually assumes a golden color. By adjusting the doping amount of sulfuric acid, the electrical conductivity of an acetylene high polymer having a high cis content can be adjusted as desired within the range of $10^{-9}$ to $10^3$ $ohm^{-1}.cm^{-1}$, and the electrical conductivity of an acetylene high polymer having a high trans content can be adjusted as desired within the range of $10^{-5}$ to $10^3$ $ohm^{-1}.cm^{-1}$. The electrical conductivity of a high polymer having an arbitrary cis-trans ratio can be adjusted as desired within the range of from the electrical conductivity of the undoped polymer to $10^3$ $ohm^{-1}.cm^{-1}$.

The mechanical properties of the acetylene high polymer after addition of sulfuric acid are much the same as those of the original high polymer. Accordingly, its flexibility is retained, and particularly, a treated high polymer having a high cis content has good flexibility.

The amount of sulfuric acid with which the acetylene high polymer is doped is at most 300 parts by weight per 100 parts by weight of the acetylene high polymer.

Sulfur trioxide used in this invention includes fuming sulfuric acid containing sulfur trioxide and compounds which form sulfur trioxide upon decomposition, such as disulfur trioxide.

Doping of the acetylene high polymer having a fibrous microcrystalline structure with sulfur trioxide is carried out, for example, by (1) a method which comprises dipping the acetylene high polymer directly in sulfur trioxide, (2) a method which comprises placing sulfur trioxide in an organic or inorganic solvent not reactive with it, dipping the acetylene polymer in the solvent, and doping the acetylene high polymer with sulfur trioxide which diffuses through the solvent, or (3) a method which comprises placing the acetylene high polymer in vacuum or in an inert gas, and doping the acetylene high polymer with a vapor of sulfur trioxide.

When the acetylene high polymer is doped with sulfur trioxide, it does not change in appearance but retains a silver metallic luster if the concentration of sulfur trioxide in the polymer is low. But with an increase in concentration, the acetylene high polymer gradually assumes a golden color. By adjusting the doping amount of sulfur trioxide, the electrical conductivity of a high polymer having a high cis content can be adjusted as desired within the range of $10^{-9}$ to $10^3$ $ohm^{-1}.cm^{-1}$, and the electrical conductivity of a high polymer having a high cis content can be adjusted as desired within the range of $10^{-5}$ to $10^3$ $ohm^{-1}.cm^{-1}$. The electrical conductivity of a high polymer having an arbitrary cis-trans ratio can equally be adjusted as desired within the range of from the electrical conductivity of the undoped polymer to $10^3$ $ohm^{-1}.cm^{-1}$.

The mechanical properties of the acetylene high polymer after addition of sulfur trioxide are much the same as those of the original high polymer. Accordingly, its flexibility is retained, and particularly, a treated high polymer having a high cis content has good flexibility.

The amount of sulfur trioxide with which the acetylene high polymer is doped is at most 300 parts by weight per 100 parts by weight of the acetylene high polymer.

The superstrong acid, as referred to herein, is a compound expressed by the following general formula (4).

$$R^{13}-SO_3H \qquad (4)$$

wherein $R^{13}$ represents Cl, F or a halogen-substituted hydrocarbon group having not more than 5 carbon atoms. Typical specific examples include fluorosulfuric acid, chlorosulfuric acid and trifluoromethanesulfuric acid.

The compound of formula (4) may be used as a mixture with not more than 0.5 mole, per mole of the compound of formula (4), of at least one compound selected from sulfur trioxide, arsenic pentafluoride, thallium pentafluoride and antimony pentafluoride.

The superstrong acid ester, as used herein, is a compound expressed by the general formula (5).

$$R^{13}-SO_3-R^{14} \qquad (5)$$

wherein $R^{13}$ is the same as defined in formula (4), and $R^{14}$ represents an alkyl group having not more than 5 carbon atoms. Typical specific examples include methyl fluorosulfate, ethyl fluorosulfate, methyl chlorosulfate, methyl trifluoromethanesulfonate, and ethyl trifluoromethanesulfonate.

Doping of the acetylene high polymer having a fibrous microcrystalline structure with the superstrong acid or its ester is carried out, for example, by (1) a method which comprises dipping the acetylene high polymer directly in the superstrong acid or its ester, (2) a method which comprises placing the superstrong acid or its ester in an organic or inorganic solvent not reactive with it, dipping the acetylene high polymer in this solvent, and doping the acetylene high polymer with the superstrong acid or its ester which diffuses through the solvent, or (3) a method which comprises placing the acetylene high polymer in vacuum or in an inert gas, and doping the acetylene high polymer with a vapor of the superstrong acid or its ester.

When the acetylene high polymer is doped with the superstrong acid or its ester, the acetylene high polymer does not change in appearance but retains a silver metallic luster if the concentration of the superstrong acid or its ester in the polymer is low. But with an increase in concentration, the acetylene polymer gradually assumes a golden color. By adjusting the doping amount of the superstrong acid or its ester, the electrical conductivity of a high polymer having a high cis content can be adjusted as desired within the range of $10^{-9}$ to $10^3$ ohm$^{-1}$.cm$^{-1}$, and the electrical conductivity of a high polymer having a high trans content can be adjusted as desired within the range of $10^{-5}$ to $10^3$ ohm$^{-1}$.cm$^{-1}$. The electrical conductivity of a high polymer having an arbitrary cis-trans ratio can also be adjusted as desired within a range of from the electrical conductivity of the undoped polymer to $10^3$ ohm$^{-1}$.cm$^{-1}$.

The mechanical properties of the acetylene high polymer after the addition of the superstrong acid or its ester are much the same as those of the original polymer. Accordingly, its flexibility is retained, and particularly, a doped high polymer having a high cis content has good flexibility.

The amount of the superstrong acid or its ester with which the acetylene high polymer is doped is at most 300 parts by weight per 100 parts by weight of the acetylene high polymer.

Aluminum tribromide, boron tribromide and boron trichloride used in this invention may be used as a mixture of two or more.

Doping of the acetylene high polymer having a fibrous microcrystalline structure with an electron acceptor compound selected from aluminum tribromide, boron tribromide and boron trichloride is carried out, for example, by (1) a method which comprises dipping the acetylene high polymer directly into the electron acceptor compound, (2) a method which comprises placing the electron acceptor compound in an organic or inorganic solvent not reactive with it, dipping the acetylene high polymer in this solvent, and doping the acetylene high polymer with the electron acceptor compound which diffuses through the solvent (according to this treating method, a difference in electrical conductivity may be noted depending upon the solvent used), (3) a method which comprises placing the acetylene high polymer in vacuum or in an inert gas, and doping the acetylene high polymer with a vapor of the electron acceptor compound, or (4) a method which comprises heating the electron acceptor compound in vacuum or in an inert gas to a temperature above its melting point, and dipping the acetylene high polymer in the molten compound.

As a result of doping these electron acceptor metal halides, the weight of the acetylene high polymer increases by 100% at most. The electrical conductivity of the acetylene high polymer after doping increases with an increase in weight, and reaches 1 ohm$^{-1}$.cm$^{-1}$ at the highest.

Examples of the compounds of general formulae (1), (2) and (3) and the naphthoquinones used in this invention include tetracyanoethylene, tetrafluoroethylene, trifluoroethylene, 1,1-difluoroethylene, 1,2-difluoroethylene, monofluoroethylene, p-benzoquinone, p-iodanil, p-chloranil, p-bromanil, 2,3-dichloro-5,6-dicyano-p-benzoquinone, 2,3-dicyano-p-benzoquinone, tetracyano-p-benzoquinone, 2,6-dinitro-p-benzoquinone, 2,6-dinitro-p-benzoquinone, 7,7,8,8-tetracyano-p-quinodimethane, 2-methyl-7,7,8,8-tetracyanoquinodimethane, 2,5-dimethyl-7,7,8,8-tetracyanoquinodimethane, 2-methoxy-7,7,8,8-tetracyanoquinodimethane, 2-chloro-7,7,8,8-tetracyanoquinodimethane, 2-bromo-7,7,8,8-tetracyanoquinodimethane, 1,2-naphthoquinone, 1,4-naphthoquinone, 2,6-naphthoquinone, 1-nitroso-2-naphthol, 2-nitroso-1-naphthylamine, 4-nitroso-1-naphthol, and 4-nitroso-1-naphthylamine. These organic electron acceptor compounds may be used as a mixture of two or more.

Doping of the acetylene high polymer having a fibrous microcrystalline structure with the above organic electron acceptor compound is carried out, for example, by (1) a method which comprises placing the electron acceptor compound in an organic or inorganic solvent not reactive with it, dipping the acetylene high polymer in the solvent, and doping the acetylene polymer with the electron acceptor compound which diffuses through the solvent (according to this treating method, a difference in electrical conductivity may be noted depending upon the solvent used), (2) a method which comprises placing the acetylene high polymer in vacuum or an inert gas and doping the acetylene high polymer with a vapor of the electron acceptor compound, or (3) a method which comprises heating the electron acceptor compound in vacuum or in an inert gas to a temperature above its melting point, and dipping the acetylene high polymer in the molten compound.

As a result of doping of the organic electron acceptor compounds, the weight of the acetylene high polymer increases by 100% at most. The electrical conductivity of the acetylene high polymer after doping increases with an increase in weight, and reaches $10^{-2}$ ohm$^{-1}$.cm$^{-1}$ at the highest.

The temperature at which the electron acceptor compound is doped in this invention is not particularly restricted. But since the acetylene high polymer decomposes at more than 300° C., doping is preferably carried out at a temperature of less than 300° C. Doping may be carried out in the air, but is preferably carried out in an oxygen-free condition because the acetylene high polymer is susceptible to oxidative degradation by oxygen.

The acetylene high polymer used in this invention may have any desired cis content, but when it is desired to obtain an acetylene high polymer having a high electrical conductivity, the starting acetylene polymer preferably has a high cis content.

The electrical conductivity can be controlled over a broad range of $10^{-9}$ to $10^3$ ohm$^{-1}$.cm$^{-1}$ by varying the type and amount of the dopant of this invention. Control may be performed, for example, by (i) a method which comprises performing doping while measuring the electrical resistance of the polymer, and (ii) a method which comprises performing the doping while measuring an increase in weight. The electrical conductivity of the acetylene high polymer can be controlled as desired by, for example, discharging the dopant when an acetylene high polymer having a predetermined electrical conductivity is obtained.

The following Examples illustrate the present invention in greater detail.

EXAMPLE 1

[Production of an acetylene high polymer]

To a 500 ml glass reaction vessel was added in an atmosphere of nitrogen, 5.1 ml (15.0 millimoles) of titanium tetrabutoxide, and it was dissolved in 20.0 ml of toluene. With stirring, 5.4 ml (40 millimoles) of triethyl aluminum was added and reacted to prepare a catalyst solution.

The reaction vessel was cooled with liquid nitrogen. THe nitrogen gas in the system was exhausted by a vacuum pump, and then the reaction vessel was cooled to −78° C.

The reaction vessel was rotated to adhere the catalyst solution uniformly to the inner wall of the reaction vessel. Immediately then, while the reaction vessel is kept stationary, purified acetylene gas under 1 atmosphere was introduced and its polymerization was started. Simultaneously with the starting of polymerization, an acetylene high polymer having a metallic luster deposited on the inner wall of the reaction vessel. The polymerization reaction was performed at a temperature of −78° C. for one hour while maintaining the pressure of acetylene at 1 atmosphere. The unreacted acetylene was then discharged by a vacuum pump to stop the polymerization. The remaining catalyst solution was removed in a nitrogen atmosphere by a syringe. While maintaining the temperature at −78° C., the residue was repeatedly washed with 100 ml of purified toluene six times, and then vacuum dried at room temperature.

A film-like acetylene high polymer having a thickness of 90 μm and a cis content of 98% was obtained at that portion of the inner wall of the reactor to which the catalyst solution had adhered, with an area equal to that portion.

The film-like acetylene high polymer had an electrical conductivity (the direct current four-probe method) at 20° C. of $2.5 \times 10^{-8}$ ohm$^{-1}$.cm$^{-1}$.

[Doping and results]

This film-like acetylene high polymer was dipped for 5 seconds in nitric acid (special reagent grade with an HNO$_3$ content of 61%), and immediately then, withdrawn for measurement of its electrical conductivity. It was found to have an electrical conductivity of 57 ohm$^{-1}$.cm$^{-1}$ at 20° C. The doped film had flexibility and was tough.

EXAMPLE 2

Nitric acid used in Example 1 was put into the glass reaction vessel, and the air inside was removed by a vacuum pump. Then, the film-like acetylene high polymer obtained in Example 1 was suspended in the gaseous-phase portion of the vessel and doped with a vapor of nitric acid at room temperature for 5 minutes.

After the doping with nitric acid, the weight of the film-like acetylene high polymer increased by 5.2%. The polymer had an electrical conductivity at 20° C. of 48 ohm$^{-1}$.cm$^{-1}$.

EXAMPLE 3

[Production of an acetylene high polymer]

A 1-liter glass reactor, completely purged with nitrogen gas, was charged successively at room temperature with 200 ml of toluene purified in a customary manner as a polymerization solvent and 2.94 millimoles of tetrabutoxytitanium and 7.34 millimoles of triethyl aluminum as catalysts to prepare a catalyst solution. The catalyst solution was a homogeneous solution. The reactor was cooled with liquid nitrogen, and nitrogen gas in the system was discharged by a vacuum pump.

The reactor was cooled to −78° C., and while the catalyst solution was stirred by a magnetic stirrer, purified acetylene gas under a pressure of 1 atmosphere was blown into the catalyst solution. In the initial stage of the polymerization reaction, the entire system became gelatin-like, and was difficult to stir. While maintaining the pressure of the acetylene gas at 1 atmosphere, the polymerization reaction was continued for 24 hours. The system was gelatin-like and assumed a reddish violet. After the polymerization, the unreacted acetylene gas was removed. While the temperature of the system was maintained at −78° C., the polymerization product was washed repeatedly with 200 ml of purified toluene four times. After the washing, the solution assumed a slightly brownish color, and the catalyst was not completely removed. The gel-like acetylene polymer swollen in toluene was in the form of uniform chips in which fibrous microcrystals were entangled. No powdery or lumpy polymer formed.

A part of the uniform gel was taken out and dried, and the amount of the acetylene high polymer in the gel was measured. It was found that the gel-like material contained 10% by weight of the acetylene high polymer.

[Molding of the acetylene polymer]

The aforesaid gel-like material was put into a mold having a thickness of 19 mm, a length of 100 mm and a width of 50 mm, held between chrome-plated ferroplates, and press-formed at room temperature under a pressure of 100 kg/cm$^2$ while removing toluene to afford a flexible, tough film-like molded article having a film thickness of 5 mm.

The film-like molded article was a P-type semiconductor having an electrical conductivity (measured by the direct current four-probe method) of $5 \times 10^{-8}$ ohm$^{-1}$.cm$^{-1}$.

[Doping and results]

The film-like molded article was treated with nitric acid in the same way as in Example 2. After the doping with nitric acid, the weight increase of the molded article was 6.6%. The doped article had an electrical conductivity at 20° C. of 105 ohm$^{-1}$.cm$^{-1}$. The doped molded article had flexibility and was tough.

EXAMPLE 4

The film-like acetylene high polymer having a cis content of 98% obtained in Example 1 was put into a flask, and the inside of the flask was evacuated by a vacuum pump. The inside of the flask was maintained at $10^{-3}$ mmHg, and the polymer was heated to 200° C. externally by an electrical furnace to perform its isomerization for 1 hour to afford a film-like acetylene high polymer having a trans content of 97%.

The film-like acetylene high polymer had an electrical conductivity at 20° C. of $6.2 \times 10^{-5}$ ohm$^{-1}$.cm$^{-1}$. This film-like acetylene high polymer was doped with nitric acid in the same way as in Example 2.

After doping with the nitric acid, the weight increase of the film-like acetylene high polymer was 4.8%, and the polymer had an electrical conductivity at 20° C. of 21 ohm$^{-1}$.cm$^{-1}$.

EXAMPLE 5

The same film-like acetylene high polymer as used in Example 1 was doped in the same way as in Example 2 except that fuming nitric acid (specific gravity 1.52, special reagent grade, a product of Kanto Chemical Co., Ltd.) was used instead of the nitric acid in Example 1. After the doping, the film-like acetylene high polymer had an electrical conductivity at 20° C. of 77 ohm$^{-1}$.cm$^{-1}$.

EXAMPLE 6

A sample, 44 mm long and 5 mm wide, was cut off from the 90 μm-thick portion of the film-like acetylene higher polymer having a cis content of 98% obtained in Example 1, and was stretched to a length of 85 mm under a load.

The stretched film was doped with nitric acid in the same way as in Example 2.

The electrical conductivity of the doped stretched film had anisotropy, and it had an electrical conductivity at 20° C. of 125 ohm$^{-1}$.cm$^{-1}$ in the stretching direction, and 37 ohm$^{-1}$.cm$^{-1}$ in a direction perpendicular to the stretching axis.

EXAMPLE 7

[Production of an acetylene high polymer]

A 500 ml glass reaction vessel was charged in an atmosphere of nitrogen with 5.1 ml (15.0 millimoles) of titanium tetrabutoxide, and it was dissolved in 20.0 ml of toluene. With stirring, 5.4 ml (40 millimoles) of triethyl aluminum was added and reacted to prepare a catalyst solution.

The reaction vessel was cooled with liquid nitrogen, and nitrogen gas in the system was discharged by a vacuum pump. Then, the reaction vessel was cooled to −78° C.

The reaction vessel was rotated to adhere the catalyst solution uniformly to the inner wall of the reaction vessel. Immediately then, while the reaction vessel was kept stationary, purified acetylene gas under a pressure of 1 atmosphere was introduced, and its polymerization was started. Simultaneously with the starting of the polymerization, an acetylene high polymer having a metallic luster deposited onto the inner wall of the reaction vessel. The polymerization reaction was performed for 1 hour at a temperature of −78° C. while maintaining the pressure of acetylene at 1 atmosphere. The unreacted acetylene was then discharged by a vacuum pump, and the polymerization was stopped. In an atmosphere of nitrogen, the remaining catalyst solution was removed by a syringe. While maintaining the temperature at −78° C., the residue was repeatedly washed with 100 ml of purified toluene six times, and then vacuum dried at room temperature.

A film-like acetylene high polymer having a thickness of 90 μm and a cis content of 98% was obtained at that part of the inner wall of the reactor to which the catalyst solution had adhered, with an area equal to that part.

The film-like acetylene high polymer had an electrical conductivity (the direct current four-probe method) of $2.5 \times 10^{-8}$ ohm$^{-1}$.cm$^{-1}$ at 20° C.

[Doping and results]

The film-like acetylene high polymer was dipped in 5 seconds in sulfuric acid ($H_2SO_4$ content 97%; for precision analysis; a product of Wako Pure Chemicals Co., Ltd.), and immediately then withdrawn for measurement of its electrical conductivity. It was found to have an electrical conductivity at 20° C. of 530 ohm$^{-1}$.cm$^{-1}$. The film after doping had flexibility and was tough.

EXAMPLE 8

The same sulfuric acid as used in Example 7 was put into a glass vessel, and the air inside was removed by a vacuum pump. The film-like acetylene high polymer obtained in Example 7 was suspended in the gas-phase portion of the vessel, and treated with a vapor of sulfuric acid at room temperature for 24 hours.

After treatment with sulfuric acid, the weight increase of the film-like acetylene high polymer was 15%, and it had an electrical conductivity at 20° C. of 570 ohm$^{-1}$.cm$^{-1}$.

EXAMPLE 9

[Production of an acetylene high polymer]

A 1-liter glass reactor, completely purged with nitrogen gas, was charged successively at room temperature with 200 ml of toluene purified in a customary manner as a polymerization solvent and 2.94 millimoles of tetrabutoxy titanium and 7.34 millimoles of triethyl aluminum as a catalyst to prepare a catalyst solution. The catalyst solution was a homogeneous solution. The reactor was cooled with liquid nitrogen, and nitrogen gas in the system was discharged by a vacuum pump.

The reactor was cooled to −78° C., and while the catalyst solution was stirred by a magnetic stirrer, purified acetylene gas under a pressure of 1 atmosphere was blown into it. In the initial stage of the polymerization reaction, the entire system became gelatin-like, and was difficult to stir.

While maintaining the pressure of acetylene gas at 1 atmosphere, the polymerization reaction was continued for 24 hours. The system was gelatin-like and assumed a reddish violet color. After the polymerization, the unreacted acetylene gas was removed, and while maintaining the temperature of the system at −78° C., the polymerization product was repeatedly washed with 200 ml of purified toluene four times. After the washing, the solution was slightly brownish, and the catalyst was not completely removed. The gel-like acetylene polymer swollen in toluene was a uniform gel-like material in which fibrous microcrystals having a diameter of 200 to 300 Å were irregularly entangled with each other. No powdery or lumpy polymer formed.

A part of the uniform gel-like material was taken out and dried. The amount of the acetylene high polymer in the gel-like material was measured. It was found that the gel-like material contained 10% by weight of the acetylene high polymer.

[Molding of the acetylene high polymer]

The gel-like material was put into a mold having a thickness of 10 mm, a length of 100 mm and a width of 50 mm, held between chrome-plated ferro-plates, and press-formed at room temperature and under a pressure of 100 kg/cm$^2$ while removing toluene to afford a flexible tough film-like molded product having a film thickness of 5 mm.

This film-like molded article was a P-type semiconductor having an electrical conductivity (measured by the direct current four-probe method) at 20° C. of $5 \times 10^{-8}$ ohm$^{-1}$.cm$^{-1}$.

[Doping and results]

The film-like molded article was treated with sulfuric acid in the same way as in Example 8. After doping with sulfuric acid, the weight increase of the molded article was 16%, and the polymer had an electrical conductivity at 20° C. of 1,750 ohm$^{-1}$.cm$^{-1}$. After the doping, the acetylene high polymer was a flexible tough film.

EXAMPLE 10

[Isomerization of an acetylene high polymer]

The film-like acetylene high polymer having a cis content of 98% obtained in Example 7 was put into a flask, and the inside of the flask was evacuated by a vacuum pump. While maintaining the inside of the flask at a pressure of 10$^{-3}$ mmHg, the polymer was heated to 200° C. externally by an electrical furnace to perform its isomerization for 1 hour and thereby to afford a film-like acetylene high polymer having a trans content of 97%.

[Doping and results]

The film-like acetylene high polymer had an electrical conductivity at 20° C. of $6.2 \times 10^{-5}$ ohm$^{-1}$.cm$^{-1}$.

This film-like acetylene high polymer was doped with sulfuric acid in the same way as in Example 8.

After treatment with sulfuric acid, the weight increase of the film-like acetylene high polymer was 17%, and it had an electrical conductivity at 20° C. of 380 ohm$^{-1}$.cm$^{-1}$.

EXAMPLE 11

The same film-like acetylene high polymer as obtained in Example 7 was doped in the same way as in Example 7 except that dilute sulfuric acid consisting of 10 ml of sulfuric acid used in Example 7 and 10 ml of distilled water was used instead of the sulfuric acid used in Example 7. After the doping, the film-like acetylene high polymer had an electrical conductivity at 20° C. of 325 ohm$^{-1}$.cm$^{-1}$.

EXAMPLE 12

[Stretching of an acetylene high polymer]

A sample, 44 mm long and 5 mm wide, was cut off from the 90 μm-thick portion of the film-like acetylene high polymer having a cis content of 98% and obtained in Example 7, and was stretched to a length of 85 mm under a load.

[Doping and results]

The stretched film was treated with sulfuric acid in the same way as in Example 8. The stretched film treated with sulfuric acid had an anisotropic electrical conductivity. Its electrical conductivity was 1,200 ohm$^{-1}$.cm$^{-1}$ in the stretching direction, and 470 ohm$^{-1}$.cm$^{-1}$ in a direction perpendicular to the stretching axis.

EXAMPLE 13

[Production of an acetylene high polymer]

In an atmosphere of nitrogen, a 500 ml glass reaction vessel was charged with 5.1 ml (15.0 millimoles) of titanium tetrabutoxide, and it was dissolved in 20.0 ml toluene. With stirring, 5.4 ml (40 millimoles) of triethyl aluminum was added and reacted to prepare a catalyst solution.

The reaction vessel was cooled with liquid nitrogen, and nitrogen gas in the system was discharged by a vacuum pump. Then, the reaction vessel was cooled to −78° C.

The reaction vessel was rotated to adhere the catalyst solution uniformly to the inner wall of the reaction vessel. Immediately then, while the reaction vessel was kept stationary, purified acetylene gas under a pressure of 1 atmosphere was introduced, and its polymerization was started. Simultaneously with the starting of the polymerization, an acetylene high polymer having a metallic luster deposited on the inner wall of the reaction vessel. The polymerization reaction was carried out for 1 hour at a temperature of −78° C. while maintaining the pressure of acetylene at 1 atmosphere. Then, the unreacted acetylene was discharged by a vacuum pump to stop the polymerization. The residual catalyst solution was removed by a syringe in an atmosphere of nitrogen. While maintaining the temperature at −78° C., the residue was washed repeatedly with 100 ml of purified toluene six times, and then vacuum dried at room temperature.

A film-like acetylene high polymer having a cis content of 98% and a film thickness of 90 μm was obtained at that part of the inner wall of the reactor to which the catalyst solution had adhered, with an area equal to that part.

The film-like acetylene high polymer had an electrical conductivity (the direct current four-probe method) of $2.5 \times 10^{-8}$ ohm$^{-1}$.cm$^{-1}$ at 20° C.

[Doping and results]

The resulting film-like acetylene high polymer was put into a glass reaction vessel, and the air inside was removed by a vacuum pump. Sulfur trioxide (used after distilling a commercial grade) was cooled to −78° C., and a vapor of it having a vapor pressure at this temperature was introduced into the reaction vessel to dope the polymer with sulfur trioxide for 15 minutes.

After doping, the unreacted sulfur trioxide was discharged out of the system by a vacuum pump. After doping with sulfur trioxide, the weight increase of the film-like acetylene high polymer was 12%, and the polymer had an electrical conductivity at 20° C. of 525 ohm$^{-1}$.cm$^{-1}$. After the doping, the acetylene high polymer had flexibility and was tough.

EXAMPLE 14

[Production of an acetylene high polymer]

A 1-liter glass reactor, purged completely with nitrogen gas, was charged successively with 200 ml of toluene purified in a customary manner as a polymerization solvent and 2.94 millimoles of tetrabutoxy titanium and 7.34 millimoles of triethyl aluminum as a catalyst to prepare a catalyst solution. The catalyst solution was a homogeneous solution. The reactor was cooled with liquid nitrogen, and nitrogen gas in the system was discharged by a vacuum pump.

The reactor was cooled to −78° C., and while the catalyst solution was stirred by a magnetic stirrer, purified acetylene gas under a pressure of 1 atmosphere was blown into it. In the initial stage of the polymerization reaction, the entire system was gelatin-like, and was difficult to stir.

While maintaining the pressure of the acetylene gas at 1 atmosphere, the polymerization reaction was continued for 24 hours. The system was gelatin-like and assumed a reddish violet color. After the polymerization, the unreacted acetylene gas was removed, and while maintaining the temperature of the system at −78° C., the residue was washed repeatedly with 200 ml of purified toluene four times. After the washing, the solution was slightly brownish, and the catalyst was not completely removed. The gel-like acetylene polymer swollen in toluene was in the form of uniform chips in which fibrous microcrystals were entangled. No powdery or lumpy polymer formed.

A part of the uniform gel-like material was taken out and dried, and the amount of the acetylene high polymer in the gel-like material was measured. The gel-like material was found to contain 10% by weight of the acetylene high polymer.

[Molding of the acetylene high polymer]

The gel-like material was put into a mold having a thickness of 10 mm, a length of 100 mm and a width of 50 mm, held between chrome-plated ferro-plates, and press-formed at room temperature and a pressure of 100 kg/cm$^2$ while removing toluene to afford a flexible and tough film-like molded article having a film thickness of 5 mm.

The film-like molded article was a P-type semiconductor having an electrical conductivity (measured by the direct current four-probe method) of $5 \times 10^{-8}$ ohm$^{-1}$.cm$^{-1}$.

[Doping and results]

The film-like molded article was doped with sulfur trioxide in the same way as in Example 13. After doping with sulfur trioxide, the weight increase of the molded article was 14%, and the polymer had an electrical conductivity at 20° C. of 1,540 ohm$^{-1}$.cm$^{-1}$. The doped molded article had flexibility and was tough.

EXAMPLE 15

[Isomerization of an acetylene high polymer]

The film-like acetylene high polymer having a cis content of 98% obtained in Example 13 was put into a flask, and the inside of the flask was evacuated by a vacuum pump. While maintaining the inside of the flask at a pressure of 10$^{-3}$ mmHg, the polymer was heated to 200° C. externally by an electrical furnace to perform its isomerization for 1 hour. Thus, a film-like acetylene high polymer having a trans content of 97% was obtained.

[Doping and results]

The film-like acetylene high polymer obtained had an electrical conductivity at 20° C. of 6.2×10$^{-5}$ ohm$^{-1}$.cm$^{-1}$. The film-like acetylene high polymer was doped with sulfur trioxide in the same way as in Example 13.

After the doping with sulfur trioxide, the weight increase of the film-like acetylene high polymer was 13%, and the polymer had an electrical conductivity at 20° C. of 230 ohm$^{-1}$.cm$^{-1}$.

EXAMPLE 16

The same film-like acetylene high polymer as used in Example 13 was doped with fuming sulfuric acid in the same way as in Example 13 except that 20% fuming sulfuric acid (Grade 1 reagent, a product of Kanto Chemical Co., Ltd.) was used instead of sulfur trioxide in Example 13. After the doping, the film-like acetylene high polymer had an electrical conductivity at 20° C. of 550 ohm$^{-1}$.cm$^{-1}$.

EXAMPLE 17

A sample, 44 mm long, 5 mm wide, was cut off from the 90 μm-thick portion of the film-like acetylene high polymer having a cis content of 98% obtained in Example 13, and was stretched to a length of 85 mm under a load.

The stretched film was treated with sulfur trioxide in the same way as in Example 13. The stretched film doped with sulfur trioxide had an anisotropic electrical conductivity. Its electrical conductivity at 20° C. was 1,650 ohm$^{-1}$.cm$^{-1}$ in the stretching direction and 410 ohm$^{-1}$.cm$^{-1}$ in a direction perpendicular to the stretching axis.

EXAMPLE 18

The film-like acetylene high polymer obtained in Example 13 was dipped for 5 seconds in 10% fuming sulfuric acid (Grade 1 reagent; a product of Kanto Chemical Co., Ltd.), and immediately then withdrawn for measurement of its electrical conductivity. Its electrical conductivity was found to be 345 ohm$^{-1}$.cm$^{-1}$ at 20° C.

EXAMPLE 19

[Production of an acetylene high polymer]

In an atmosphere of nitrogen, 5.1 ml (15.0 millimoles) of titanium tetrabutoxide was added to a 500 ml glass reaction vessel, and was dissolved in 20.0 ml of toluene. With stirring, 5.4 ml (40 millimoles) of triethyl aluminum was added and reacted to prepare a catalyst solution.

The reaction vessel was cooled with liquid nitrogen, and nitrogen gas in the system was discharged by a vacuum pump. Then, the reaction vessel was cooled to −78° C.

The reaction vessel was rotated to adhere the catalyst solution uniformly to the inner wall of the reaction vessel. Immediately then, while keeping the reactor stationary, purified acetylene gas under a pressure of 1 atmosphere was introduced, and its polymerization was started. Simultaneously with the starting of the polymerization, an acetylene high polymer having a metallic luster deposited on the inner wall of the reaction vessel. The polymerization reaction was carried out at a temperature of −78° C. for 1 hour while maintaining the pressure of acetylene at 1 atmosphere. Then, the unreacted acetylene was discharged by a vacuum pump to stop the polymerization. The remaining catalyst solution was removed by a syringe in an atmosphere of nitrogen, and while maintaining the temperature at −78° C., the residue was repeatedly washed with 100 ml of purified toluene six times, and then vacuum dried at room temperature.

A film-like acetylene high polymer having a thickness of 90 μm and a cis content of 98% was obtained at that part of the inner wall of the reactor to which the catalyst solution had adhered, with an area equal to that part.

The film-like acetylene high polymer had an electrical conductivity (the direct current four-probe method) at 20° C. of 2.5×10$^{-8}$ ohm$^{-1}$.cm$^{-1}$.

[Doping and results]

The film-like acetylene high polymer was put into a glass vessel, and the air inside was discharged by a vacuum pump. A vapor of trifluoromethanesulfuric acid (a colorless clear liquid at room temperature obtained by distilling a commercial grade) was introduced under its vapor pressure at room temperature to dope the polymer with it for 24 hours. After the doping, the unreacted trifluoromethanesulfuric acid was discharged by a vacuum pump. The weight of the resulting film-like acetylene high polymer increased by 250%, and the polymer had an electrical conductivity at 20° C. of 96 ohm$^{-1}$.cm$^{-1}$. After the doping, the acetylene high polymer was a flexible and tough film.

EXAMPLE 20

Toluene (50 ml) was put into a glass reaction vessel, and the film-like acetylene high polymer having a cis content of 98% obtained in Example 19 was dipped in the toluene. Then, the reaction vessel was cooled with liquid nitrogen, and the air in the system was discharged by a vacuum pump. The reaction vessel was cooled to −78° C. About 5 ml of trifluoromethanesulfuric acid was introduced into this system, and reacted at −78° C. for 2 hours. Then, the temperature was returned to room temperature, and the doping was performed for 24 hours.

After doping, the film-like acetylene high polymer was washed three times with 50 ml of toluene in an atmosphere of nitrogen, and then vacuum dried to remove the remaining toluene and trifluoromethanesulfuric acid.

The weight increase after the doping was 280%, and the polymer had an electrical conductivity at 20° C. of 350 ohm$^{-1}$.cm$^{-1}$.

EXAMPLE 21

[Production of an acetylene high polymer]

A 1-liter glass reactor, purged completely with nitrogen gas, was charged successively at room temperature with 200 ml of toluene purified in a customary manner as a polymerization solvent and 2.94 millimoles of tetrabutoxy titanium and 7.34 millimoles of triethyl aluminum as a catalyst to prepare a catalyst solution. The catalyst solution was a homogeneous solution. The reactor was cooled with liquid nitrogen, and nitrogen gas in the system was discharged by a vacuum pump.

The reactor was cooled to $-78°$ C., and while the catalyst solution was stirred by a magnetic stirrer, purified acetylene gas under a pressure of 1 atmosphere was blown into it. In the initial stage of the polymerization, the entire system became gelatin-like, and was difficult to stir. The polymerization reaction was continued for 24 hours while maintaining the pressure of the acetylene gas at 1 atmosphere. The system was gelatin-like and assumed a reddish violet color. After the polymerization, the unreacted acetylene gas was removed, and while maintaining the temperature of the system at $-78°$ C., the reaction product was repeatedly washed with 200 ml of purified toluene four times. After the washing, the solution was slightly brownish, and the catalyst was not completely removed. The gel-like acetylene polymer swollen in toluene was a uniform gel-like material in which fibrous microcrystals having a diameter of 200 to 400 Å were entangled at random. No powdery or lumpy polymer formed.

A part of the uniform gel-like material was taken out and dried, and the amount of the acetylene high polymer in the gel-like material was measured. If was found that the gel-like material contained 10% by weight of the acetylene high polymer.

[Molding of the acetylene high polymer]

The gel-like material was put into a mold having a thickness of 10 mm, a length of 100 mm and a width of 50 mm, held by chrome-plated ferro-plates, and press-formed at room temperature under a pressure of 100 kg/cm$^2$ while removing toluene to afford a flexible and tough film-like molded article having a film thickness of 5 mm. The film-like molded article was a P-type semiconductor having an electrical conductivity (measured by the direct current four-probe method) of $5 \times 10^{-8}$ ohm$^{-1}$.cm$^{-1}$.

[Doping and results]

The film-like molded article was doped with trifluoromethanesulfuric acid in the same way as in Example 20. After the doping, the weight increase of the molded article was 265%, and the molded article had an electrical conductivity at 20° C. of 550 ohm$^{-1}$.cm$^{-1}$.

EXAMPLE 22

The film-like acetylene high polymer having a cis content of 98% obtained in Example 19 was put into a flask, and the inside of the flask was evacuated by a vacuum pump. While maintaining the pressure at $10^{-3}$ mmHg, the polymer was heated externally to 200° C. by an electrical furnace to perform its isomerization for 1 hour and thereby to form a film-like acetylene high polymer having a trans content of 97%. This film-like acetylene high polymer was doped with trifluoromethanesulfuric acid in the same way as in Example 20.

After doping with trifluoromethanesulfuric acid, the weight increase of the film-like acetylene high polymer was 250%, and the polymer had an electrical conductivity at 20° C. of 178 ohm$^{-1}$.cm$^{-1}$.

EXAMPLE 23

The same film-like acetylene polymer as used in Example 19 was doped in the same way as in Example 19 except that fluorosulfuric acid was used instead of the trifluoromethanesulfuric acid in Example 19. After the treatment, the film-like acetylene high polymer had an electrical conductivity at 20° C. of 110 ohm$^{-1}$.cm$^{-1}$.

EXAMPLE 24

A sample, 44 mm long and 5 mm wide, was cut off from the 90 μm-thick portion of the film-like acetylene high polymer having a cis content of 98% obtained in Example 19, and was stretched to a length of 85 mm under a load.

The stretched film was doped with trifluoromethanesulfuric acid in the same way as in Example 20. The electrical conductivity of the stretched film doped with trifluoromethanesulfonic acid had antisotropy. Its electrical conductivity at 20° C. was 950 ohm$^{-1}$.cm$^{-1}$ in a direction perpendicular to the stretching axis.

EXAMPLE 25

Doping was carried out in the same way as in Example 20 except that methyl trifluoromethanesulfonate was used instead of trifluoromethanesulfonic acid used as a superstrong acid in Example 20.

After the doping, the film-like acetylene high polymer had an electrical conductivity at 20° C. of 135 ohm$^{-1}$.cm$^{-1}$.

EXAMPLES 26 TO 30

The film-like acetylene high polymer obtained in Example 19 was doped in the same way as in Example 20 except that each of the superstrong acids and esters thereof shown in Table 1 was used instead of the trifluoromethanesulfonic acid used as a superstrong acid in Example 20. The results shown in Table 1 were obtained.

TABLE 1

| | Doping results with various superstrong acids | |
|---|---|---|
| | Type of the superstrong acid | Electrical conductivity (ohm$^{-1}$ · cm$^{-1}$) |
| Example 26 | Chlorosulfuric acid | 56 |
| Example 27 | Fluorosulfuric acid:arsenic pentafluoride (1 mole:0.05 mole) | 250 |
| Example 28 | Fluorosulfuric acid:thallium pentafluoride (1 mole:0.2 mole) | 195 |
| Example 29 | Fluorosulfuric acid:antimony pentafluoride (1 mole:0.05 mole) | 180 |
| Example 30 | Methyl fluorosulfate | 44 |

EXAMPLE 31

[Production of an acetylene high polymer]

In an atmosphere of nitrogen, 5.1 ml (15.0 millimoles) of titanium tetrabutoxide was added to a 500 ml glass reaction vessel, and was dissolved in 20.0 ml of toluene. With stirring, 5.4 ml (40 millimoles) of triethyl aluminum was added and reacted to prepare a catalyst solution.

The reaction vessel was cooled with liquid nitrogen, and nitrogen gas in the system was discharged by a vacuum pump, and then the reactor was cooled to −78° C.

The reaction vessel was rotated to adhere the catalyst solution to the inner wall of the reaction vessel. Immediately then, while the reaction vessel was kept stationary, purified acetylene gas under a pressure of 1 atmosphere was introduced, and its polymerization was started. Simultaneously with the starting of the polymerization, an acetylene high polymer having a metallic luster deposited on the inner wall of the reaction vessel. The polymerization reaction was carried out for 1 hour at a temperature of −78° C. while maintaining the pressure of acetylene at 1 atmosphere. Then, the unreacted acetylene was discharged by a vacuum pump to stop the polymerization. In an atmosphere of nitrogen, the remaining catalyst solution was removed by a syringe. While maintaining the temperature at −78° C., the residue was repeatedly washed with 100 ml of purified toluene six times, and then vacuum dried at room temperature.

A film-like acetylene high polymer having a cis content of 98% and a thickness of 90 μm was obtained at that part of the inner wall of the reaction to which the catalyst solution had adhered, with an area equal to that part.

The film-like acetylene high polymer had an electrical conductivity (the direct current four-terminal method) at 20° C. of $2.5 \times 10^{-8}$ ohm$^{-1}$.cm$^{-1}$.

Observations of the film-like acetylene high polymer with a scanning electron microscope showed that this film-like acetylene high polymer was an assembly of fibrils having a diameter of 200 to 300 Å.

[Doping and results]

In an atmosphere of nitrogen, a 100 ml. reactor was charged with 50 ml of toluene and 5.0 g of aluminum tribromide. The solution was a pale yellow homogeneous solution. The aforesaid film-like acetylene high polymer was dipped in this solution, and doped for 5 hours at room temperature while keeping the solution stationary.

After the doping, the film-like acetylene high polymer was washed three times with 100 ml of toluene, and then vacuum dried to afford a blackish acetylene high polymer.

After the doping, the acetylene high polymer increased in weight by 9.7%. The polymer was a P-type semiconductor having an electrical conductivity of $4.13 \times 10^{-1}$ ohm$^{-1}$.cm$^{-1}$. The doped film-like acetylene high polymer had flexibility and was tough.

EXAMPLE 32

The film-like acetylene high polymer obtained in Example 31 was put into a glass reaction vessel, and the air inside the system was removed by a vacuum pump. Then, boron trichloride (obtained by distilling a commercial grade under vacuum) was cooled to −30° C., and a vapor of boron trichloride at this temperature was introduced into the reactor to dope the polymer for 2 hours.

After the doping, the unreacted boron trichloride was discharged out of the system by a vacuum pump. After the doping, the acetylene high polymer increased by 56% in weight, and the polymer was a P-type semiconductor having an electrical conductivity of $8.5 \times 10^{-1}$ ohm$^{-1}$.cm$^{-1}$.

EXAMPLE 33

The film-like acetylene high polymer was doped in the same way as in Example 32 except that boron tribromide was used instead of boron trichloride used as an electron acceptor compound in Example 32. After the treatment, the acetylene high polymer increased in weight by 23%, and the polymer was a P-type semiconductor having an electrical conductivity of $1.2 \times 10^{-1}$ ohm$^{-1}$.cm$^{-1}$.

EXAMPLE 34

[Production of an acetylene high polymer]

A 1-liter glass reactor, purged completely with nitrogen gas, was charged successively at room temperature with 200 ml of toluene purified in a customary manner as a polymerization solvent and 2.94 millimoles of tetrabutoxy titanium and 7.34 millimoles of triethyl aluminum as a catalyst to prepare a catalyst solution. The catalyst solution was a homogeneous solution. The reactor was cooled with liquid nitrogen, and nitrogen gas was discharged by a vacuum pump.

The reactor was cooled to −78° C., and while stirring the catalyst solution by a magnetic stirrer, purified acetylene gas under a pressure of 1 atmosphere was blown into it. In the initial stage of the polymerization reaction, the entire system became gelatin-like, and was difficult to stir.

While maintaining the pressure of the acetylene gas at 1 atmosphere, the polymerization reaction was continued for 24 hours. The system was gelatin-like and assumed a reddish violet color. After the polymerization, the unreacted acetylene gas was removed. While maintaining the temperature of the system at −78° C., the reaction product was washed repeatedly with 200 ml of purified toluene four times. After the washing, the solution was slightly brownish, and the catalyst was not completely removed. The gel-like acetylene high polymer swollen in toluene was a uniform gel-like material in which fibrous microcrystals having a diameter of 200 to 500 Å were randomly entangled. No powdery or lumpy polymer formed.

A part of the uniform gel-like material was taken out and dried, and the amount of the acetylene high polymer in the gel-like material was measured. It was found that the gel-like material contained 10% by weight of the acetylene high polymer. The resulting acetylene high polymer had a cis content of 98%.

[Molding of the acetylene high polymer]

The gel-like material was put into a mold having a thickness of 10 mm, a length of 100 mm and a width of 50 mm, held between chrome-plated ferro-plates, and press-formed at room temperature and a pressure of 100 kg/cm$^2$ while removing the toluene. A flexible and tough film-like molded article having a thickness of 5 mm was obtained.

The film-like molded article was a P-type semiconductor having an electrical conductivity (measured by the direct current four-probe method) at 20° C. of $5 \times 10^{-8}$ ohm$^{-1}$.cm$^{-1}$.

[Doping and results]

The resulting molded article was doped with aluminum tribromide in the same way as in Example 31.

After the doping, the acetylene high polymer molded article was a P-type semiconductor having an electrical conductivity of 1.02 ohm$^{-1}$.cm$^{-1}$. After the doping, the molded article was flexible and tough.

EXAMPLE 35

The film-like molded article of acetylene high polymer obtained in Example 34 was doped with boron trichloride in the same way as in Example 32.

After the doping, the acetylene high polymer increased in weight by 62%, and the polymer was a P-type semiconductor having an electrical conductivity of 1.32 ohm$^{-1}$·cm$^{-1}$.

EXAMPLE 36

The film-like molded article of acetylene high polymer obtained in Example 34 was doped with boron tribromide in the same way as in Example 33.

After the doping, the acetylene polymer increased in weight by 27%, and the polymer was a P-type semiconductor having an electrical conductivity of $2.7 \times 10^{-1}$ ohm$^{-1}$·cm$^{-1}$.

EXAMPLE 37

[Production of an acetylene high polymer]

In an atmosphere of nitrogen, 5.1 ml (15.0 millimoles) of titanium tetrabutoxide was added to a 500 ml glass reaction vessel, and dissolved in 20.0 ml of toluene. With stirring, 5.4 ml (40 millimoles) of triethyl aluminum was added and reacted to prepare a catalyst solution.

The reaction vessel was cooled with liquid nitrogen, and nitrogen gas in the system was discharged by a vacuum pump. Then, the reaction vessel was cooled to −78° C.

The reaction vessel was rotated to adhere the catalyst solution uniformly to the inner wall of the reaction vessel. Immediately then, while the reaction vessel was kept stationary, purified acetylene gas was introduced under a pressure of 1 atmosphere, and its polymerization was started. Simultaneously with the starting of the polymerization, an acetylene high polymer having a metallic luster deposited on the inner wall of the reaction vessel. The polymerization reaction was performed for 1 hour at a temperature of −78° C. while maintaining the pressure of acetylene at 1 atmosphere. Then, the unreacted acetylene was discharged by a vacuum pump to stop the polymerization. In an atmosphere of nitrogen, the remaining catalyst solution was removed by a syringe. While maintaining the temperature at −78° C., the residue was repeatedly washed with 100 ml of purified toluene six times, and then vacuum-dried at room temperature.

A film-like acetylene high polymer having a cis content of 98% and a thickness of 90 μm was obtained at that part of the inner wall of the reactor to which the catalyst solution had adhered, with an area equal to that part.

The film-like acetylene high polymer had an electrical conductivity (the direct current four-probe method) at 20° C. of $2.5 \times 10^{-8}$ ohm$^{-1}$·cm$^{-1}$.

Observation of the film-like acetylene high polymer by a scanning electron microscope showed that the film-like acetylene high polymer was an assembly of fibrils having a diameter of 200 to 300 Å.

[Doping and results]

A 100 ml reactor was charged with 50 ml of anisole and 0.20 g of tetracyanoethylene in an atmosphere of nitrogen gas. The solution was a reddish violet homogeneous solution. The film-like acetylene high polymer obtained as above was dipped in this solution, and the solution was refluxed for 75 minutes at the boiling point of anisole. The temperature of the solution was then returned to room temperature, and the acetylene high polymer was taken out and vacuum dried. After the doping, the acetylene high polymer increased in weight by 12.2% as compared with the polymer before doping.

The doped acetylene high polymer had an electrical conductivity of $1.5 \times 10^{-8}$ ohm$^{-1}$·cm$^{-1}$. When the doped acetylene high polymer was heated under vacuum, no abrupt rise in electrical resistance was noted until the temperature reached 200° C.

EXAMPLES 38 TO 45

The film-like acetylene high polymer obtained in Example 37 was doped in the same way as in Example 37 except that each of the electron acceptor compounds shown in Table 2 was used instead of the tetracyanoethylene used as an electron acceptor compound in Example 37. The results shown in Table 2 were obtained. No abrupt rise in electrical resistance was noted until the temperature of the doped acetylene high polymer reached 200° C.

TABLE 2

| | Type of the electron acceptor compound | Weight increase after doping (%) | Electrical conductivity after doping (ohm$^{-1}$·cm$^{-1}$) |
|---|---|---|---|
| Example 38 | Chloranil | 14 | $4.5 \times 10^{-3}$ |
| Example 39 | Bromanil | 19 | $4.7 \times 10^{-3}$ |
| Example 40 | 2,3-Dichloro-5,6-dicyano-p-benzoquinone | 21 | $2.1 \times 10^{-3}$ |
| Example 41 | 7,7,8,8-tetracyano-p-quinodimethane | 10 | $5.3 \times 10^{-4}$ |
| Example 42 | p-Benzotiquinone | 9 | $4.4 \times 10^{-4}$ |
| Example 43 | 2-Methyl-7,7,8,8-tetracyano-p-benzoquinone | 11 | $5.6 \times 10^{-4}$ |
| Example 44 | 2,3-Dicyano-p-benzoquinone | 18 | $5.0 \times 10^{-3}$ |
| Example 45 | 1,4-Naphthoquinone | 15 | $5.9 \times 10^{-4}$ |

EXAMPLE 46

[Production of an acetylene high polymer]

A 1-liter glass reactor, purged completely with nitrogen gas, was charged successively at room temperature with 200 ml of toluene purified in a customary manner as a polymerization solvent and 2.94 millimoles of tetrabutoxy titanium and 7.34 millimoles of triethyl aluminum as a catalyst to prepare a catalyst solution. The catalyst solution was a homogeneous solution. The reactor was cooled with liquid nitrogen, and nitrogen gas in the system was discharged by a vacuum pump.

The reactor was cooled to −78° C., and while stirring the catalyst solution by a magnetic stirrer, purified acetylene gas under a pressure of 1 atmosphere was blown into it. In the initial stage of the polymerization reaction, the entire system became gelatin-like, and was difficult to stir.

The polymerization reaction was continued for 24 hours while maintaining the pressure of the acetylene gas at 1 atmosphere. The system was gelatin-like and assumed a reddish violet color. After the polymerization, the unreacted acetylene gas was removed, and while maintaining the temperature of the system at −78° C., the polymerization product was repeatedly washed with 200 ml of purified toluene four times. After the washing, the solution was still slightly brownish, and the catalyst was not completely removed. The gel-like acetylene polymer swollen in toluene was a uniform gel-like material in which fibrous microcrystals were entangled. No powdery or lumpy polymer formed.

A part of the uniform gel-like material was taken out, and dried, and the amount of the acetylene high polymer in the gel-like material was measured. It was found that the gel-like material contained 10% by weight of the acetylene high polymer. The resulting acetylene high polymer had a cis content of 98%.

[Molding of the acetylene high polymer]

The gel-like material was put into a mold having a thickness of 10 mm, a length of 100 mm and a width of 50 mm, held between chrome-plated ferro-plates, and press-formed at room temperature and a pressure of 100 kg/cm$^2$ to afford a flexible tough film-like molded article having a film thickness of 5 mm.

The film-like molded article was a P-type semiconductor having an electrical conductivity (measured by the direct current four-probe method) at 20° C. of $5 \times 10^{-8}$ ohm$^{-1}$·cm$^{-1}$.

[Doping and results]

The film-like molded article was doped with tetracyanoethylene in the same way as in Example 37. After doping, the acetylene high polymer film had an electrical conductivity of $5.2 \times 10^{-3}$ ohm$^{-1}$·cm$^{-1}$.

EXAMPLE 47

The film-like acetylene high polymer obtained in Example 37 was doped in the same way as in Example 37 except that toluene was used instead of the anisole used at the time of doping in Example 37.

After the doping, the weight increase of the acetylene high polymer was 7.1%, and the polymer had an electrical conductivity of $7.0 \times 10^{-4}$ ohm$^{-1}$·cm$^{-1}$.

EXAMPLE 48

Five grams of tetracyanoethylene was put into a reactor, and the film-like acetylene high polymer obtained in Example 37 was suspended at the upper portion of the reactor. Under vacuum, the bottom of the reactor was heated to 50° C., and the film-like acetylene high polymer was doped for 40 minutes with a vapor of the tetracyanoethylene.

After the doping, the weight increase of the acetylene high polymer was 6.6%, and the polymer had an electrical conductivity of $5.2 \times 10^{-4}$ ohm$^{-1}$·cm$^{-1}$.

CHARACTERISTICS IN INDUSTRIAL UTILIZATION

The electrically conductive acetylene high polymer used in this invention is a P-type semiconductor whose electrical conductivity can be freely controlled from $10^{-9}$ to $10^3$ ohm$^{-1}$·cm$^{-1}$ depending upon the type and amount of the electron acceptor compound. It can be directly used as an electrically conductive material useful as flexible electric and electronics elements. In combination with an N-type semiconductor, it can be easily formed into a P-N hetero junction element. Since the acetylene high polymer has a band gap energy of 1.6 eV to 1.9 eV and shows photoconductivity under the visible light, it is also useful as various photo-electric converter elements such as a solar cell and a photosenser.

What is claimed is:

1. A process for producing an electrically conductive acetylene high polymer, which comprises doping an acetylene high polymer having a fibrous microcrystalline structure with at most 300 parts by weight of an inorganic protonic acid per 100 parts by weight of the polymer, said inorganic protonic acid being selected from the group consisting of nitric acid, fuming nitric acid, sulfuric acid, fuming sulfuric acid and a superstrong acid of the formula R—SO$_3$H, wherein R represents Cl, F or a halogen-substituted hydrocarbon group having not more than 5 carbon atoms.

2. The process set forth in claim 1, wherein the superstrong acid is used as the inorganic protonic acid.

* * * * *